United States Patent
Reggiori et al.

(10) Patent No.: US 7,882,405 B2
(45) Date of Patent: Feb. 1, 2011

(54) EMBEDDED ARCHITECTURE WITH SERIAL INTERFACE FOR TESTING FLASH MEMORIES

(75) Inventors: Riccardo Riva Reggiori, Segrate (IT); Fabio Tassan Caser, Arcore (IT); Mirella Marsella, Pandino (IT); Monica Marziani, Arcore (IT)

(73) Assignee: Atmel Corporation, San Jose, CA (US)

( * ) Notice: Subject to any disclaimer, the term of this patent is extended or adjusted under 35 U.S.C. 154(b) by 345 days.

(21) Appl. No.: 11/676,049

(22) Filed: Feb. 16, 2007

(65) Prior Publication Data

US 2008/0201623 A1 Aug. 21, 2008

(51) Int. Cl.
- G11C 29/00 (2006.01)
- G11C 7/00 (2006.01)
- G01R 31/28 (2006.01)
- G06F 11/00 (2006.01)

(52) U.S. Cl. ............... 714/718; 714/723; 714/719; 714/710; 714/738; 714/30; 365/201

(58) Field of Classification Search ............... 714/718, 714/719, 710, 723, 738, 30; 365/201
See application file for complete search history.

(56) References Cited

U.S. PATENT DOCUMENTS

| | | | |
|---|---|---|---|
| 5,638,327 A | 6/1997 | Dallabora et al. |
| 5,754,476 A | 5/1998 | Caser et al. |
| 5,781,474 A | 7/1998 | Sali et al. |
| 5,793,679 A | 8/1998 | Caser et al. |
| 5,822,247 A | 10/1998 | Tassan Caser et al. |
| 5,844,404 A | 12/1998 | Caser et al. |
| 5,848,013 A | 12/1998 | Caser et al. |
| 5,854,764 A | 12/1998 | Villa et al. |
| 6,137,725 A | 10/2000 | Caser et al. |
| 6,147,506 A | 11/2000 | Ahmad et al. |
| 6,157,054 A | 12/2000 | Caser et al. |
| 6,199,182 B1 | 3/2001 | Whetsel |
| 6,320,792 B1 | 11/2001 | Caser et al. |
| 6,427,222 B1 | 7/2002 | Shau |
| 6,560,734 B1 | 5/2003 | Whetsel |
| 6,643,810 B2 | 11/2003 | Whetsel |

(Continued)

FOREIGN PATENT DOCUMENTS

WO WO-2008100602 A1 8/2008

OTHER PUBLICATIONS

"International Application Serial No. PCT/US2008/002057, Search Report and Written Opinion mailed Jun. 20, 2008", 13 pages.

Primary Examiner—John J Tabone, Jr.
(74) Attorney, Agent, or Firm—Schwegman, Lundberg & Woessner, P.A.

(57) ABSTRACT

A flash memory device includes a flash memory array, a set of non-volatile redundancy registers, a serial interface, and testing logic coupled to the serial interface, the testing logic configured to accept a set of serial commands from an external tester; erase the array; program the array with a test pattern; read the array and compare the results with expected results to identify errors; determine whether the errors can be repaired by substituting a redundant row or column of the array, and if so, generate redundancy information; and program the redundancy information into the non-volatile redundancy registers.

14 Claims, 5 Drawing Sheets

U.S. PATENT DOCUMENTS

| | | |
|---|---|---|
| 6,731,106 B2 | 5/2004 | Whetsel |
| 6,785,174 B2 | 8/2004 | Messina et al. |
| 6,785,183 B2 | 8/2004 | Sivero et al. |
| 6,791,171 B2 | 9/2004 | Mok et al. |
| 6,804,148 B2 | 10/2004 | Bedarida et al. |
| 6,828,834 B2 | 12/2004 | Sivero et al. |
| 6,831,499 B2 | 12/2004 | Oddone et al. |
| 6,894,914 B2 | 5/2005 | Perroni et al. |
| 6,937,493 B2 * | 8/2005 | Krause et al. ................. 365/63 |
| 6,954,102 B2 | 10/2005 | Bedarida et al. |
| 6,988,232 B2 | 1/2006 | Ricchetti et al. |
| 7,028,240 B1 | 4/2006 | Bautista, Jr. et al. |
| 7,053,470 B1 * | 5/2006 | Sellers et al. ................ 257/678 |
| 7,084,699 B2 | 8/2006 | Bedarida et al. |
| 7,130,209 B2 | 10/2006 | Reggiori et al. |
| 7,181,565 B2 | 2/2007 | Surico et al. |
| 7,249,295 B2 * | 7/2007 | Fukuyama et al. .......... 714/718 |
| 7,444,546 B2 * | 10/2008 | Kimelman et al. ............ 714/31 |
| 2001/0014959 A1 | 8/2001 | Whetsel |
| 2002/0026476 A1 | 2/2002 | Miyazaki et al. |
| 2002/0136069 A1 | 9/2002 | Reggiori et al. |
| 2002/0157082 A1 | 10/2002 | Shau |
| 2002/0199139 A1 | 12/2002 | Dortu et al. |
| 2003/0221152 A1 | 11/2003 | Volkerink et al. |
| 2004/0046538 A1 | 3/2004 | Sivero et al. |
| 2004/0051564 A1 | 3/2004 | Bedarida et al. |
| 2004/0052145 A1 | 3/2004 | Sivero et al. |
| 2004/0056708 A1 | 3/2004 | Bedarida et al. |
| 2004/0057259 A1 | 3/2004 | Oddone et al. |
| 2004/0060013 A1 | 3/2004 | Isom, III et al. |
| 2004/0076037 A1 | 4/2004 | Bedarida et al. |
| 2004/0135231 A1 | 7/2004 | Keller et al. |
| 2004/0174746 A1 | 9/2004 | Bedarida et al. |
| 2004/0181729 A1 | 9/2004 | Whetsel |
| 2005/0026476 A1 | 2/2005 | Mok et al. |
| 2005/0151248 A1 | 7/2005 | Shau |
| 2005/0226051 A1 | 10/2005 | Bedarida et al. |
| 2005/0237073 A1 | 10/2005 | Miller et al. |
| 2006/0044885 A1 | 3/2006 | Frulio et al. |
| 2006/0077709 A1 | 4/2006 | Frulio et al. |
| 2006/0077714 A1 | 4/2006 | Surico et al. |
| 2006/0077746 A1 | 4/2006 | Sivero et al. |
| 2006/0083060 A1 | 4/2006 | Reggiori et al. |
| 2006/0083097 A1 | 4/2006 | Frulio et al. |
| 2006/0107160 A1 | 5/2006 | Ricchetti et al. |
| 2006/0140010 A1 | 6/2006 | Bedarida et al. |
| 2006/0161727 A1 | 7/2006 | Surico et al. |
| 2006/0168491 A1 | 7/2006 | Lee et al. |
| 2006/0170489 A1 | 8/2006 | Bedarida et al. |
| 2006/0170490 A1 | 8/2006 | Bedarida et al. |
| 2006/0250851 A1 | 11/2006 | Surico et al. |
| 2006/0253644 A1 | 11/2006 | Surico et al. |
| 2007/0025134 A1 | 2/2007 | Reggiori et al. |
| 2007/0083699 A1 | 4/2007 | Surico et al. |

* cited by examiner

EMBEDDED ARCHITECTURE WITH SERIAL INTERFACE FOR TESTING FLASH MEMORIES

BACKGROUND OF THE INVENTION

1. Field of the Invention

The present invention pertains to testing circuitry for flash memories, and to improvements in the time needed to screen flash memory arrays. More particularly, the present invention pertains to flash memory integrated circuits with on-board testing circuitry.

2. The Prior Art

It is well known that screening a flash array accounts for the majority of the time spent during flash memory testing. Flash array screening usually consists of a sequence of erasing the array, programming the array with a pattern, and reading and verifying the pattern written into the array. If the programmed pattern can be verified, then the array is assumed to be defect free, otherwise, if errors occur, some defects have been detected. Repeating the sequence with different patterns allows for the highlighting of different types of faults.

Thus, a key point in testing the array is determining whether or not the defects can be repaired by substituting a redundant row or column of the array, and calculating the redundancy information, which, once permanently stored in the device, will be used during the entire life cycle of the chip to substitute the faulty part of the array.

As technology features scale down and flash memory densities grow larger, the total number of interactions increase between the external tester and the flash memory during the array screening, becoming a real bottleneck. This is mainly due to the low frequency used to interface the flash memory with the external tester. Such low frequencies are needed to avoid bouncing and noise, because of the long cables connecting the probe card with the testing apparatus.

To deal with this issue, one of the testing strategies has been to embed on the chip all the logic and circuitry necessary for testing the array, thus reducing the number of interactions between the tester and the array. This strategy is also known as B.I.S.T. (Built-In Self Test).

Another common strategy to reduce test time has usually been to increase the number of dice tested in parallel. In this way, cost is shifted to expensive probe cards with larger buses for address and data, and complexity is transferred to longer software codes.

BRIEF DESCRIPTION OF THE INVENTION

An architecture for embedded testing of flash memory is presented. The present invention improves total testing time, thus reducing the overall die cost. It combines a serial interface, to increase the number of dice tested in parallel, with on-chip logic able to screen the memory array and reduce the number of interactions with an external tester.

In one aspect of the present invention, a flash memory device includes a flash memory array, a set of non-volatile redundancy registers, a serial interface, and testing logic coupled to the serial interface. The testing logic is configured to accept a set of serial commands from an external tester; erase the array; program the array with a test pattern; read the array and compare the results with expected results to identify errors; determine whether the errors can be repaired by substituting a redundant row or column of the array, and if so, generate redundancy information; and program the redundancy information into the non-volatile redundancy registers.

In another aspect of the invention, a method for testing a flash memory array on a flash memory device is disclosed. The flash memory device includes a set of non-volatile redundancy registers, a serial interface, and testing logic coupled to the serial interface. The method comprises the steps of the testing logic: accepting a set of serial commands from an external tester; erasing the array; programming the array with a test pattern; reading the array and comparing the results with expected results to identify errors; determining whether the errors can be repaired by substituting a redundant row or column of the array, and if so, generating redundancy information; and programming the redundancy information into the non-volatile redundancy registers.

The present invention aims at reducing the testing time of flash memories by combining a serial interface to increase the number of dice tested in parallel, without over increasing the total number of wires on the probe card (which will be referred to herein as $S^2I\_LOGIC$), and embedded logic to speed up the execution of test routines on the array, minimizing the total number of data exchanges between the external tester and the flash device (which will be referred to herein as BIST_LOGIC).

To fulfill this task, the architecture of the present invention is able to accept a set of serial commands from an external tester and start its operations; to erase the array; to program the array using a standard pattern; to read the array and compare the results with an expected pattern; to calculate whether or not the errors can be repaired by substituting a redundant row or column and to calculate the related redundancy information; to store the redundancy information inside its volatile registers; to program into non volatile registers the redundancy information stored in its volatile registers; and to read the information stored in the non volatile registers into its volatile registers.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

The architecture of the present invention can be extended to chips with N redundancy resources made of K bits, where N is the number of redundancy resources available on the device and K is the number of bits needed to completely describe a single resource.

Figure 1:
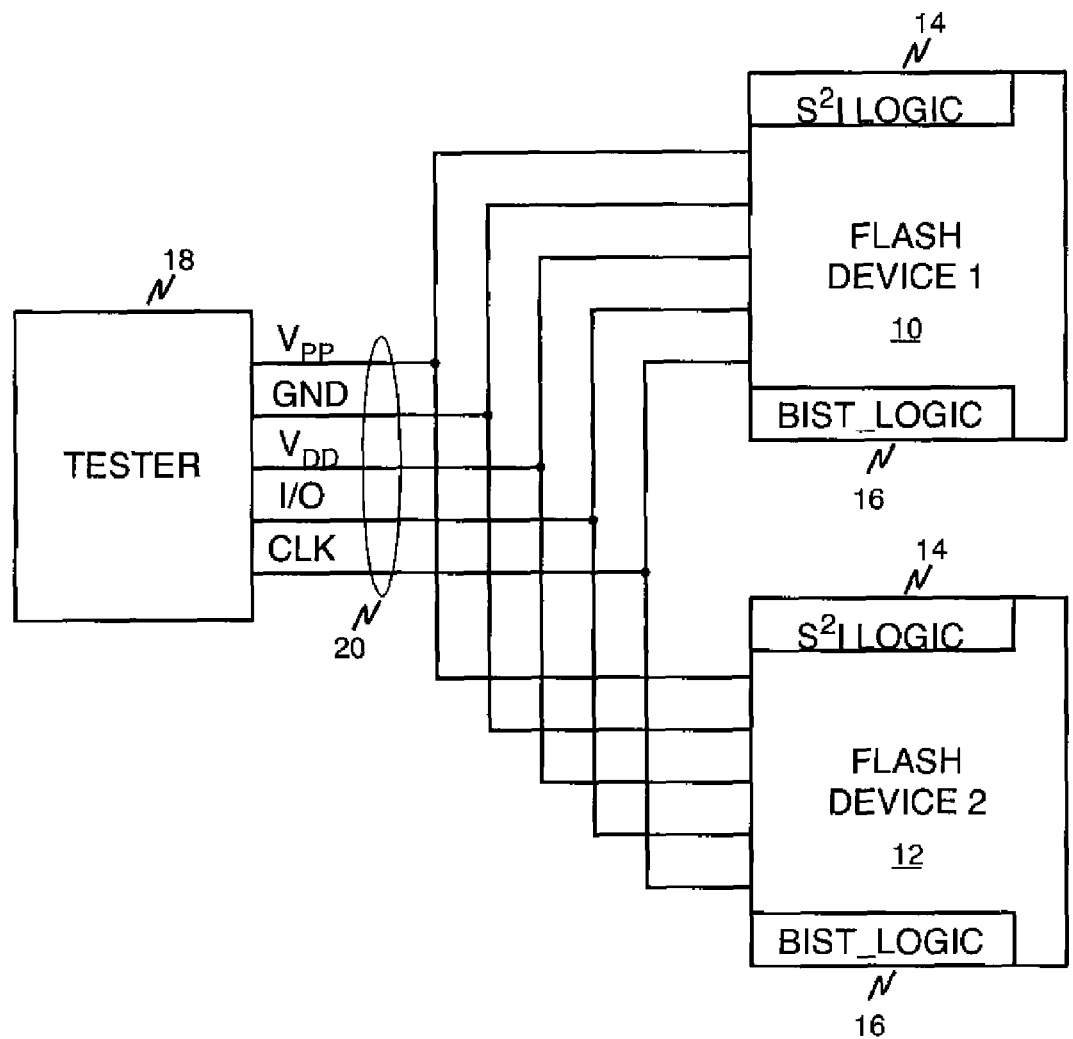
FIG. 1 is a block diagram showing flash memory devices configured according to the principles of the present invention coupled to a tester.

Referring now to FIG. 1, a block diagram shows two flash memory devices 10 and 12 configured according to the principles of the present invention and including a $S^2I\_logic$ block 14 and a BIST logic block 16. Flash memory devices 10 and 12 are coupled to a tester 18 via a 5-wire bus 20. The 5-wire bus 20 includes $V_{PP}$, a potential that may be used to program the flash memory devices 10 and 12, $V_{DD}$ to supply the standard power for the flash memory devices 10 and 12, GND, to supply the standard ground reference to the flash memory devices 10 and 12, I/O, a bi-directional serial data line used to exchange data between the tester and the flash memory devices 10 and 12, and CLK, a clock signal used to synchronize the data exchange between the tester and the flash memory devices 10 and 12.

Figure 2:
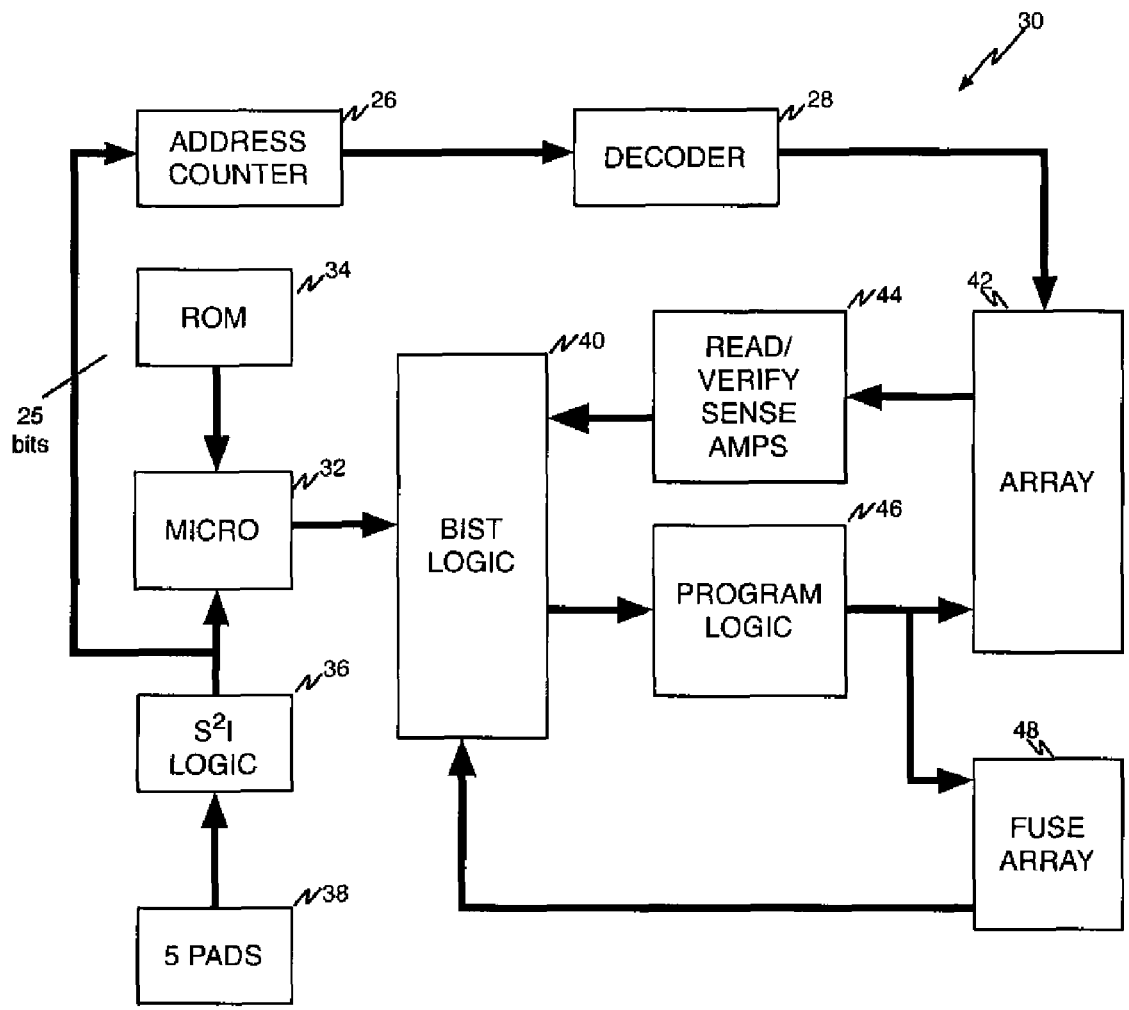
FIG. 2 is a block diagram of an integrated circuit in accordance with the present invention.

Referring now to FIG. 2, a block diagram shows an illustrative integrated circuit 30 having features in accordance with the present invention. As shown in FIG. 2, the integrated circuit 30 includes several circuits. MICRO 32 is a processor that executes instructions. ROM 34 is a read only memory that stores instructions executable by the MICRO 32. S²I_LOGIC 36 is a circuit that decodes the serial commands coming from the external tester and sends back information about the status of the current internal operation (on going or finished). PADS 38 are the five device I/O pads defined by the S²I specification. ADDRESS COUNTER 26 is connected to S²I_LOGIC 36, and DECODER 28 is connected to ADDRESS COUNTER 26 and ARRAY 42.

BIST_LOGIC 40 is a logic circuit that reads the data coming from the ARRAY 42 through the READ/VERIFY SENSE AMPS 44, defines redundancy information to be stored into its volatile registers, loads the PROGRAM LOGIC 46 to program the ARRAY 42 with a standard test pattern, loads the PROGRAM LOGIC 46 to program the FUSE ARRAY 48, and loads the redundancy information from the FUSE ARRAY 48 into its volatile registers.

Figure 3:
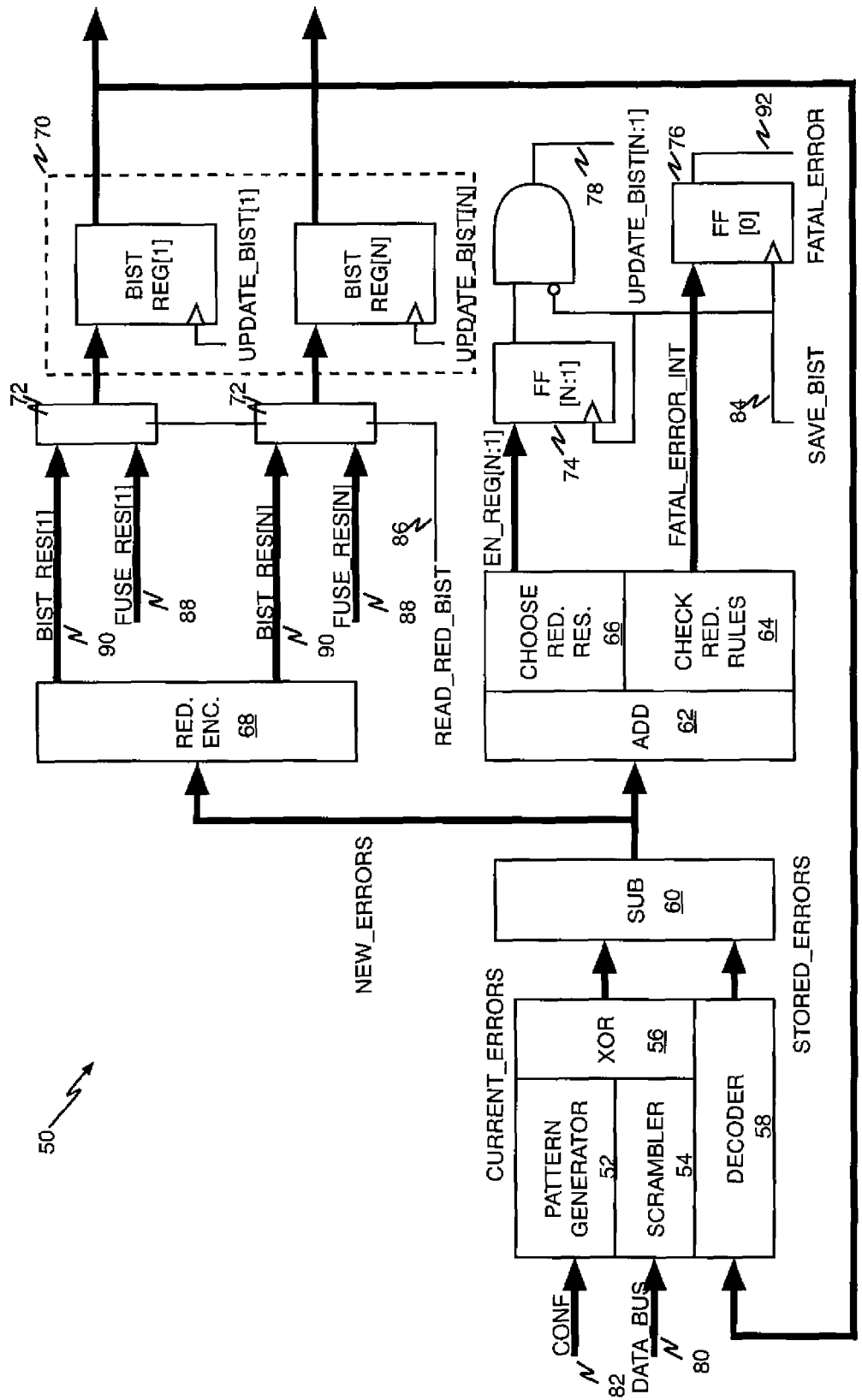
FIG. 3 is a block diagram showing the BIST architecture according to the present invention.

Referring now to FIG. 3, a block diagram shows architecture for a BIST logic circuit 50 according to the principles of the present invention. The following discussion assumes a flash memory chip with N redundancy resources of K bits each. Persons of ordinary skill in the art will readily be able to configure such an architecture with other configurations of redundancy resources.

The BIST_LOGIC circuit 50 includes several circuit blocks. PATTERN GENERATOR 52 is a circuit driven by commands from the S²I that generates a reference data pattern given the current row and column addresses (for instance ALL0, ALL1, checkerboard, diagonal, etc.). SCRAMBLER 54 is a circuit that scrambles the data read from the flash array in a standard format (i.e., if the device reads four words of 16 bits each in parallel, the scrambler may, for example, order the words from left to right and from most significant bit (MSB) to least significant bit (LSB) in a sequence of fourth word, third word, second word, first word.)

XOR 56 is a circuit that compares the scrambled data from the array with the reference pattern from the PATTERN GENERATOR 52 and outputs a current error vector. DECODER 58 is a circuit that, given the current redundancy configuration, decodes the already-detected errors (previous error vector). SUB 60 is a subtractor circuit that determines the new error vector, subtracting the previous error vector, which is from the DECODER, from the current error vector, which is from the XOR. ADDER 62 is an adder circuit that counts the number of new errors in the new error vector. CHECK REDUNDANCY RULES 64 is a circuit that determines if the new errors are repairable or not (many different rules may be implemented as defined by a user). If one or more new errors are not repairable, CHECK REDUNDANCY RULES 64 issues a FATAL_ERROR_INT signal. As an example, a simple rule that may be implemented where two redundancy resources are available is to assert the signal FATEL_ERROR_INT if there are more than two new errors in the current page.

CHOOSE REDUNDANCY RESOURCE 66 is a circuit that determines which redundancy resources are to be used. In the architecture shown in FIG. 3, assume an example with two redundancy resources. If resource[1] is to be used, then the signal EN_REG[1] is driven high from CHOOSE REDUNDANCY RESOURCE 66. If resource[2] is to be used, then signal EN_REG[2] is driven high from CHOOSE REDUNDANCY RESOURCE 66. If both resources are to be used, both signals EN_REG[1] and EN_REG[2] are driven high from CHOOSE REDUNDANCY RESOURCE 66. If no resources are needed then both signals EN_REG[1] and EN_REG[2] are driven low from CHOOSE REDUNDANCY RESOURCE 66. Different filling sequences may be implemented depending on the chip redundancy architecture.

REDUNDANCY ENCODER 68 is a circuit that encodes the positions of the new errors, using information used by the SCRAMBLER 54. It can then encode data identifying the word and the particular output within that word in which the errors occurred.

BIST_REG[N:1] 70 are a set of N volatile registers, each having K bits, that can be either loaded with the current status of the redundancy stored in the fuse array or updated with the new redundancy calculated by the embedded redundancy logic depending on the state of the multiplexers 72.

FF[N:1] 74 are N flip-flops used to synchronize N signals EN_REG[N:1] on the rising edge of SAVE_BIST signal. FF[0] 76 is a flip-flop used to synchronize the signal FATAL_ERROR_INT on the rising edge of the SAVE_BIST signal. UPDATE_BIST[N:1] on lines 78 are N signals used to selectively trigger registers BIST_REG[N:1] 70.

The BIST_LOGIC has several inputs. DATA_BUS 80 is driven with a page of data read out of the flash array from the READ/VERIFY SENSE AMPS 44 of FIG. 2. CONF 82 is any number of signals coming from the S²I_LOGIC 36 of FIG. 2 used to select the current desired reference pattern. SAVE_BIST 84 is a pulse issued by the MICRO 32 of FIG. 2 during the execution of a scan routine each time a new page has been read from the array. READ_RED_BIST 86 is a signal issued by the MICRO 32 of FIG. 2 to switch the multiplexers 72 so that the current status of redundancy may be loaded into the BIST_REG 70. FUSE_RESOURCE[N:1] 88 is N×K bits of redundancy information coming from the N non volatile registers of the flash memory.

The BIST_LOGIC has several outputs. BIST_REG[N:1] 70 are N volatile registers made of K bits, each one associated with one of the N redundancy resources of the chip. FATAL_ERROR 92 is a signal showing if the new errors in the last page read from the array can be repaired by substituting a redundant row or column.

An example of a simple scan routine useful to verify a pattern and to calculate and store the needed redundancy includes the following procedures:
  1. load current redundancy status from fuses;
  2. read a page;
  3. trigger a SAVE_BIST pulse;
  4. check FATAL_ERROR signal;
  5. if FATAL_ERROR=1 then exit and throw away the die;
  6. if FATAL_ERROR=0 then increase the current page address;
  7. jump to step 2 until the scan is completed.

Figure 4:
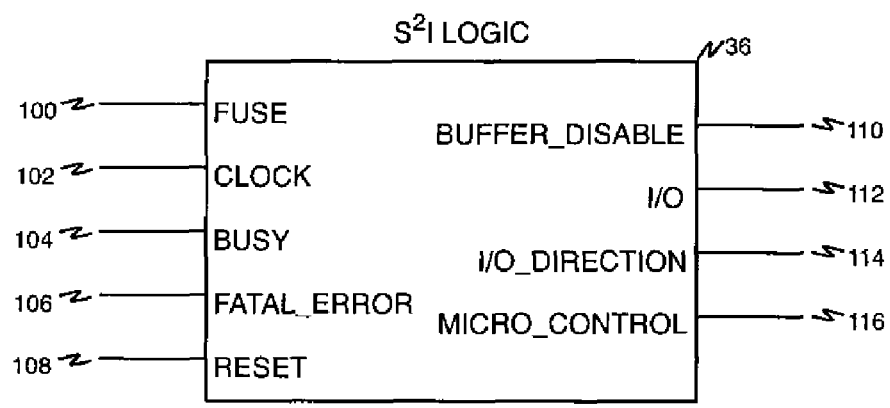
FIG. 4 is a diagram showing a $S^2I\_LOGIC$ block in accordance with the present invention.

Referring now to FIG. 4, a diagram shows an S²I_LOGIC block that controls the S²I interface in accordance with the present invention. S²I_LOGIC is a logic circuit controlling the interface and has several input and output lines. The FUSE input 100 controls a fuse that if programmed permanently disables the S²I interface. The CLOCK Input 102 carries a clock signal used to synchronize data exchange between the flash memory device and the tester. The BUSY input 104 carries a signal from the MICRO 32 showing if the current routine is being performed or is completed. The FATAL_ERROR input 106 is a signal from the BIST_LOGIC 40 showing whether or not the current portion of the array can be repaired by substituting a redundant row or column. The RESET input 108 is a signal to reset the S²I_LOGIC.

The BUFFER_DISAB output 110 is a signal to shut off the buffer leakage once the pads are left floating. The I/O 112 is a bi-directional line. It accepts input commands from the tester and it outputs either FATAL_ERROR, used to notify the tester if an unrepairable error has occurred, or BUSY, used to notify the external tester when the internal operation has finished. An internal state machine will change the information on the I/O line 112, depending on the current status of the ongoing operation. The I/O_DIRECTION line 114 outputs a signal to show if I/O 112 is in input or output mode. Both the tester and the flash memory device to which it is coupled must share the same protocol to understand when the I/O line is in input or output mode. The MICRO_CONTROL output 116 is a set of signals used to trigger the MICRO 32 and make it execute the correct test routine.

The present invention advantageously utilizes a set of commands that are used to trigger all the operations that will be executed by the embedded testing logic. An exemplary command set is shown in the following table. Persons of ordinary skill in the art will appreciate that the present invention is not limited to the command set shown herein and that other useful commands may be specified for operating the apparatus disclosed herein. Persons of ordinary skill in the art will appreciate that software or firmware for providing this command set will vary depending on the exact circuitry used to implement the circuit blocks disclosed in the drawing figures herein. The provision of such software or hardware is a routine exercise for a person of ordinary skill in the art.

Command Table

| COMMAND | COMMENT |
| --- | --- |
| S²I_INIT | Software reset |
| S²I_INIT_BIST | Software reset for BIST registers |
| S²I_LATCH_ADD | Latch plane address |
| S²I_BIST_ALL0 | Scan matrix for ALL0 pattern and check redundancy |
| S²I_BIST_ALL1 | Scan matrix for ALL1 pattern and check redundancy |
| S²I_BIST_CHKB | Scan matrix for CHKB pattern and check redundancy |
| S²I_BIST_INVCHKB | Scan matrix for INVCHKB pattern and check redundancy |
| S²I_BIST_DIAG0 | Scan matrix for DIAG0 pattern and check redundancy |
| S²I_BIST_DIAG1 | Scan matrix for DIAG1 pattern and check redundancy |
| S²I_BIST_PG_ALL0 | Program matrix (ALL0 pattern) |
| S²I_BIST_PG_CHKB | Program matrix (CHKB pattern) |
| S²I_BIST_PG_INVCHKB | Program matrix (INVCHKB pattern) |
| S²I_BIST_PG_DIAG0 | Program matrix (DIAG0 pattern) |
| S²I_BIST_PG_DIAG1 | Program matrix (DIAG1 pattern) |
| S²I_BIST_ER_MAT | Erase matrix |
| S²I_BIST_PG_CAM | Program fuse array (store pattern in BIST registers) |
| S²I_BIST_DISAB_CAM | Disable unused fuses |

Figure 5:
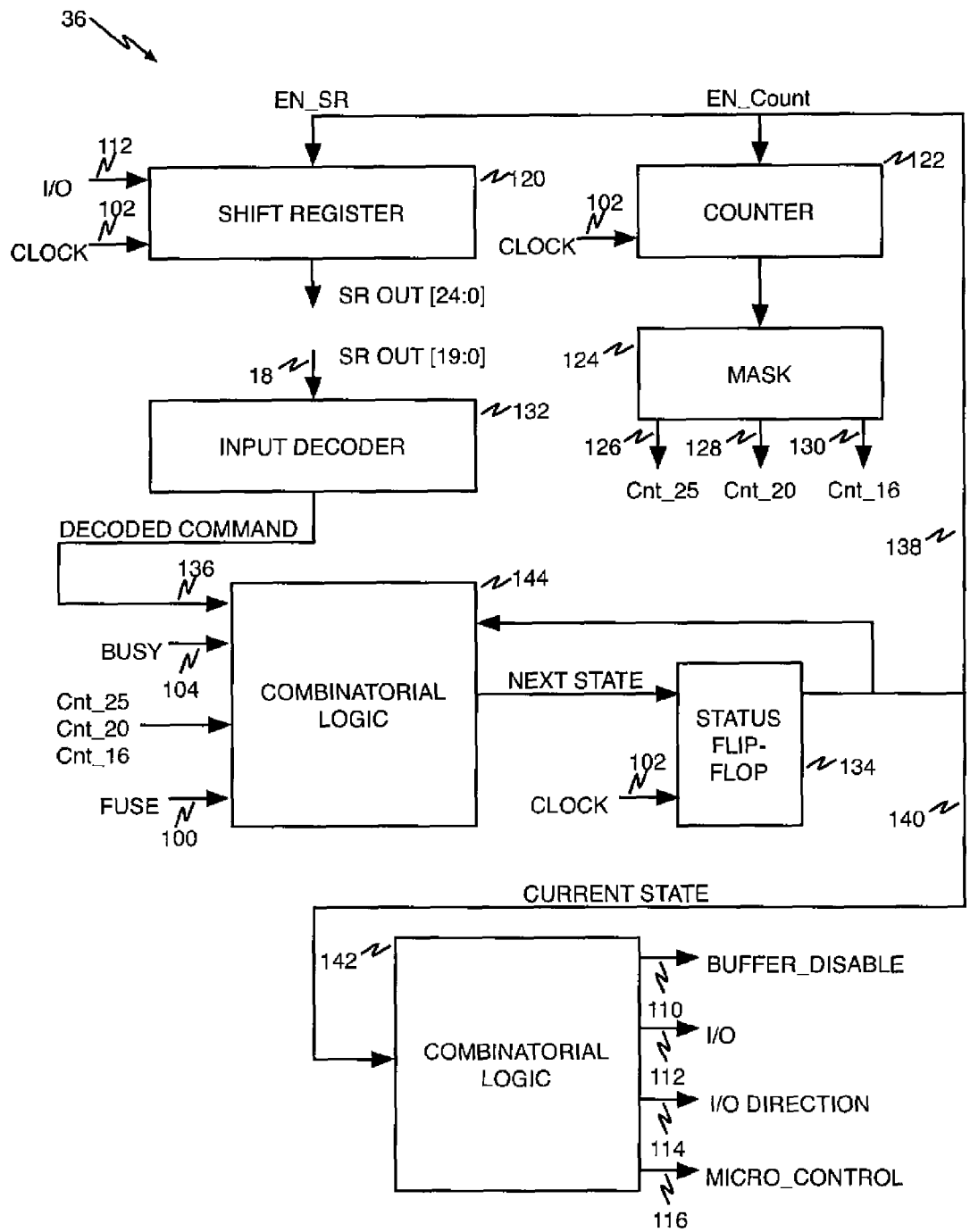
FIG. 5 is a block diagram showing in more detail a $S^2I\_LOGIC$ block in accordance with the present invention.

Referring now to FIG. 5, a block diagram shows the S²I_LOGIC block 36 in more detail. The clock input 102 and I/O input 112 are used to operate shift register 120. In one embodiment of the present invention, shift register 120 is formed using 25 flip-flops. Shift register 120 is used to acquire from the serial I/O input 112 the instruction code (20 bits), the address (25 bits), and the data (16 bits) to be programmed.

Counter 122 is a 6-bit counter in one embodiment of the present invention, and is also driven from clock input 102. The output of counter 122 is presented to counter mask 124. Three outputs Cnt__25 (reference numeral 126), Cnt__20 (reference numeral 128), and Cnt__16 (reference numeral 130) developed in counter mask 124, indicate the complete acquisition of the instruction code, address, and data, respectively.

Input decoder 132 decodes the 20-bit instruction code provided from shift register 120 and defines which of the operations defined by the commands shown in the command table above is to be performed. A state machine formed from combinatorial logic 144 and status flip-flop 134 determines the future states based on the current state and the status of the inputs of the combinatorial logic 144, which include the decoded command from input decoder 132 on lines 136, the BUSY input 104 of the S²I_LOGIC block, the Cnt__25, Cnt__20, and Cnt__16 outputs of counter mask 124, and the FUSE input 100 of the S²I_LOGIC block. The output of flip-flop 134 includes one bit that drives the enable inputs of shift register 120 and counter 122 on line 138.

Other output bits from status flip-flop 134 on lines 140 drive combinatorial logic 142. Based on the current state and the shift register data, combinatorial logic 142 controls the direction of the data on I/O line 112 of the S²I_LOGIC block by asserting a signal on line 114 of the S²I_LOGIC block, and provides the embedded microcontroller 32 (FIG. 2) with the several inputs discussed with reference to FIG. 4.

Figure 6:
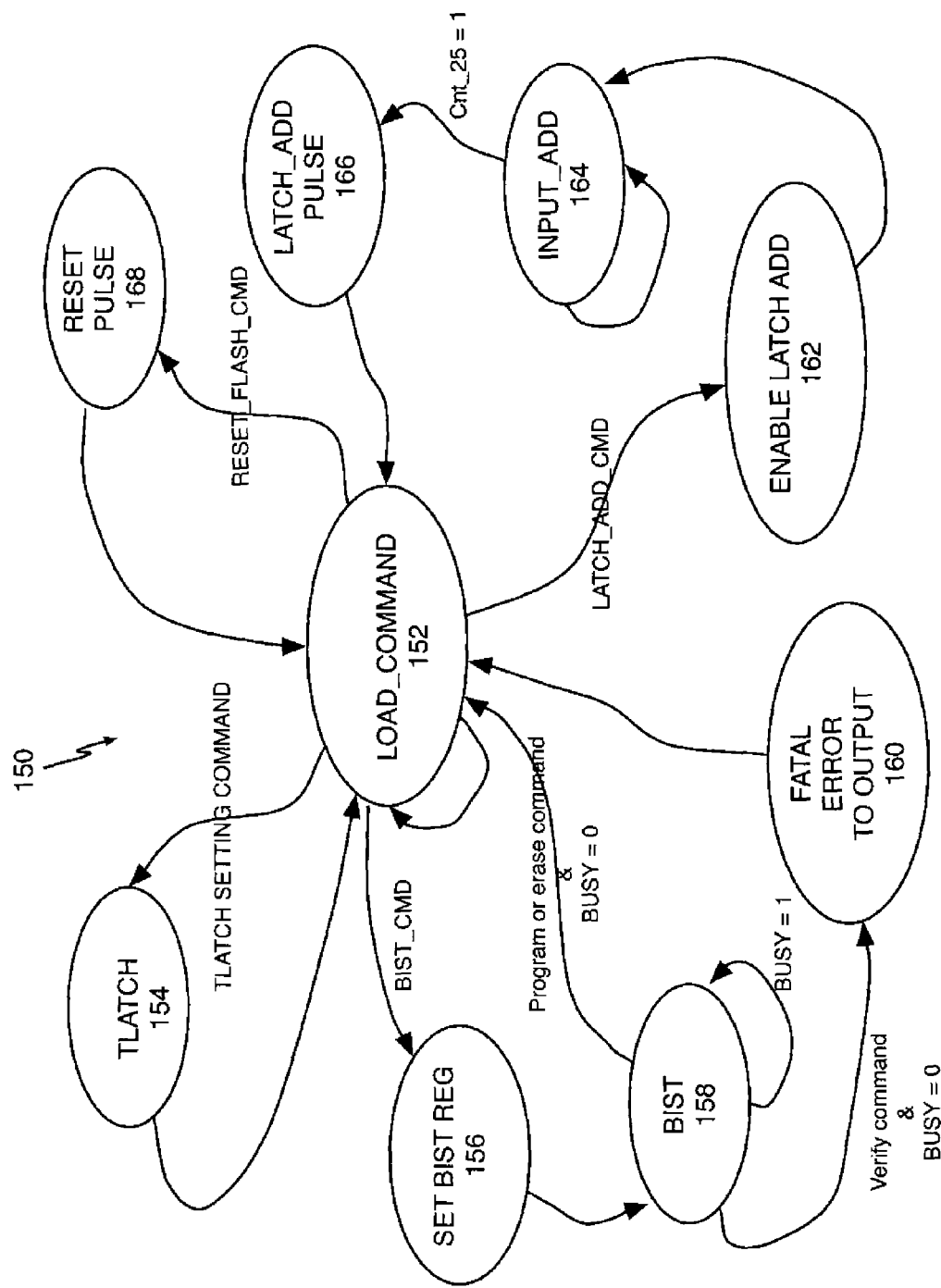
FIG. 6 is a state diagram in accordance with the present invention.

Referring now to FIG. 6, a state diagram 150 is shown corresponding to the state machine formed from combinatorial logic 144 and status flip-flop 134. At state 152, the LOAD_COMMAND is issued. If there is a TLATCH SETTING COMMAND, a TLATCH command is issued at state 154, before returning back to state 152.

If a BIST_CMD is issued at state 152, then a SET BIST REG command is issued at step 156, before proceeding with the BIST at step 158. At state 158, as long as the BUSY signal equals 1 (i.e., the current routine is still being performed), the state machine loops back to state 158. If the BUSY signal equals 0 (i.e., the current routine is completed) and there has been a program or erase command, the state machine returns to state 152. If the BUSY signal equals 0 and there has been a verify command, the state machine proceeds to state 160, where the FATAL_ERROR signal is output before returning to state 152.

If a LATCH_ADD_CMD is issued at state 152, then the ENABLE LATCH ADD command is issued at state 162. The state machine then proceeds to state 164, where the INPUT_ADD command is issued until the Cnt_25 value equals 1. If the Cnt__25 value equals 1, the state machine proceeds to state 166, where a LATCH_ADD pulse is implemented before returning to state 152.

If a RESET_FLASH_CMD is issued at step 152, then a RESET pulse is implemented at state 168 before returning to state 152.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A flash memory device comprising:
   a flash memory array;
   a set of non-volatile redundancy registers;
   pads to couple to an external tester through a five-wire connection during a testing of the flash memory device;
   a serial interface to couple to the pads to decode a set of serial commands exchanged between the external tester and the flash memory device through a single bi-directional pad included in the pads; and
   testing logic coupled to the serial interface and configured to:
      accept the set of serial commands from the serial interface;
      generate a test pattern based on the set of serial commands decoded by the serial interface;
      erase the array;
      program the array with the test pattern;
      read the array and compare results from reading of the array with expected results to identify errors;
      determine whether the errors can be repaired by substituting a redundant row or column of the array, and generate redundancy information if the errors can be repaired; and
      program the redundancy information into the non-volatile redundancy registers,
   wherein the serial interface comprises a state machine formed from a status flip-flop and a first combinatorial logic block having a plurality of inputs, the state machine configured to determine a future state based on a current state and the plurality of inputs,
   wherein the plurality of inputs includes:
      a busy input that carries a signal indicating whether a routine is currently being performed or is completed;
      a fuse input that controls a permanent disablement of the serial interface;
      an instruction input that indicates a complete acquisition of an instruction code;
      an address input that indicates a complete acquisition of an address; and
      a data input that indicates a complete acquisition of data.

2. The flash memory device of claim 1, further comprising a sense amplifier, wherein the testing logic is configured to read data from the array through the sense amplifier.

3. The flash memory device of claim 1, wherein the testing logic further comprises a pattern generator configured to generate the expected results based on commands received from the serial interface.

4. The flash memory device of claim 3, wherein the testing logic further comprises a scrambler circuit configured to receive and scramble data read from the array.

5. The flash memory array of claim 4, wherein the testing logic further comprises a circuit configured to compare the expected results received from the pattern generator with the scrambled data received from the scrambler circuit.

6. A method for testing a flash memory array in a flash memory device, the flash memory device including a set of non-volatile redundancy registers, a serial interface coupled to an external tester, and testing logic coupled to the serial interface, the method comprising:
   using the serial interface to decode a set of serial commands exchanged between the external tester and the flash memory device through a single bi-directional pad included in pads of the flash memory device, the pads being coupled to the external tester through a five-wire connection;
   generating a test pattern based on the set of serial commands decoded by the serial interface;
   erasing the array;
   programming the array with the test pattern;
   reading the array and comparing results from the reading with expected results to identify errors;
   determining whether the errors can be repaired by substituting a redundant row or column of the array, and generating redundancy information if the errors can be repaired; and
   programming the redundancy information into the non-volatile redundancy registers,
   wherein the serial interface comprises a state machine formed from a status flip-flop and a first combinatorial logic block having a plurality of inputs, the state machine configured to determine a future state based on a current state and the plurality of inputs,
   wherein the plurality of inputs includes:
      a busy input that carries a signal indicating whether a routine is currently being performed or is completed;
      a fuse input that controls a permanent disablement of the serial interface;
      an instruction input that indicates a complete acquisition of an instruction code;
      an address input that indicates a complete acquisition of an address; and
      a data input that indicates a complete acquisition of data.

7. The method of claim 6, further comprising a sense amplifier, wherein the testing logic is configured to read data from the array through the sense amplifier.

8. The method of claim 6, wherein the testing logic further comprises a pattern generator configured to generate the expected results based on commands received from the serial interface.

9. The method of claim 8, wherein the testing logic further comprises a scrambler circuit configured to receive and scramble data read from the array.

10. The method of claim 9, wherein the testing logic further comprises a circuit configured to compare the expected results received from the pattern generator with the scrambled data received from the scrambler circuit.

11. A device comprising:
   a non-volatile memory array;
   an additional array to store redundancy information;
   pads to couple to an external tester through a connection during a testing of the device; and
   a serial interface coupled to the non-volatile memory array and the additional array, the serial interface configured to receive serial commands exchanged between the external tester and the device through a single bi-directional pad included in the pads during testing of the device, wherein the non-volatile memory array and the serial interface are located on a same chip,
   wherein the connection includes a five-wire connection,
   wherein the five-wire connection includes:
      a first wire to supply a potential to program the non-volatile memory array during the testing of the device;
      a second wire to supply a first supply voltage to the device during the testing of the device;
      a third wire to supply a second supply voltage to the device during the testing of the device;
      a fourth wire to exchange data between the device and the external tester during the testing of the device; and
      a fifth wire to carry a clock signal during the testing of the device.

12. The device of claim 11 further comprising testing logic configured to erase the non-volatile memory array during the testing of the device.

13. The device of claim 11, wherein the serial interface includes a state machine.

14. The device of claim 11 further comprising a read-only memory to store instructions.

* * * * *